(12) United States Patent
Cho

(10) Patent No.: US 8,143,710 B2
(45) Date of Patent: Mar. 27, 2012

(54) WAFER-LEVEL CHIP-ON-CHIP PACKAGE, PACKAGE ON PACKAGE, AND METHODS OF MANUFACTURING THE SAME

(75) Inventor: Yun-Rae Cho, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 100 days.

(21) Appl. No.: 12/612,022

(22) Filed: Nov. 4, 2009

(65) Prior Publication Data

US 2010/0109138 A1    May 6, 2010

(30) Foreign Application Priority Data

Nov. 6, 2008   (KR) .................. 10-2008-0109802

(51) Int. Cl.
*H01L 23/02* (2006.01)
*H01L 23/48* (2006.01)
(52) U.S. Cl. .. 257/686; 257/784; 257/778; 257/E23.145
(58) Field of Classification Search .................. 257/686, 257/784, 778, E23.145
See application file for complete search history.

(56) References Cited

U.S. PATENT DOCUMENTS

| | | | | |
|---|---|---|---|---|
| 6,153,928 | A * | 11/2000 | Cho | 257/686 |
| 6,303,997 | B1 * | 10/2001 | Lee | 257/778 |
| 6,344,401 | B1 | 2/2002 | Lam | |
| 2002/0074652 | A1 * | 6/2002 | Pierce | 257/724 |
| 2007/0246819 | A1 * | 10/2007 | Hembree et al. | 257/698 |
| 2008/0050901 | A1 * | 2/2008 | Kweon et al. | 438/597 |
| 2008/0197469 | A1 * | 8/2008 | Yang et al. | 257/686 |
| 2008/0308917 | A1 * | 12/2008 | Pressel et al. | 257/676 |

FOREIGN PATENT DOCUMENTS

| | | |
|---|---|---|
| JP | 2003-526922 | 9/2003 |
| KR | 2001-27266 | 4/2001 |
| KR | 2002-86612 | 11/2002 |
| KR | 2008-6299 | 1/2008 |

\* cited by examiner

*Primary Examiner* — Nitin Parekh
(74) *Attorney, Agent, or Firm* — Stanzione & Kim, LLP

(57) ABSTRACT

A method of manufacturing a multi-chip package in which a plurality of semiconductor chips are mounted on a single package using a chip-on-chip technique reduces warping due to a difference in coefficients of thermal expansion (CTEs) between a printed circuit board (PCB) and a stacked semiconductor chip. A package on package is manufactured by vertically stacking packages to operate a memory semiconductor chip package and a logic semiconductor chip package in a single system. To improve a non-wet defect of solder balls used to connect packages and minimize the mounting height of the package on package, a protection member formed of an epoxy mold compound (EMC) is formed on the memory semiconductor chip package to only partially expose the solder balls, and the exposed portions of the solder balls are connected to vias formed in a rear surface of the logic semiconductor chip package using a solder ball attaching process.

13 Claims, 9 Drawing Sheets

WAFER-LEVEL CHIP-ON-CHIP PACKAGE, PACKAGE ON PACKAGE, AND METHODS OF MANUFACTURING THE SAME

CROSS-REFERENCE TO RELATED APPLICATIONS

This application claims the benefit of Korean Patent Application No. 10-2008-0109802, filed Nov. 6, 2008, which is incorporated herein by reference in its entirety.

BACKGROUND

1. Field of the Invention

Example embodiments relate to a wafer-level chip-on-chip package and a package on package (PoP), which reduce a mounting height and improve solder joint reliability, and more particularly, to a multi-chip package in which a plurality of semiconductor chips are mounted on a single package using a chip-on-chip technique, a method of manufacturing the multi-chip package, a package on package in which a plurality of packages having different functions are vertically stacked and operate in a single system, and a method of manufacturing the package on package.

2. Description of the Related Art

In recent years, as electronic products have become increasingly multifunctional and downscaled, and larger numbers of semiconductor devices per unit volume are being mounted in electronic products. To meet these needs, a system-on-chip (SOC) technique and a system-in-package (SIP) technique have been utilized in semiconductor manufacturing processes.

The SOC technique enables integration of functions of a plurality of semiconductor chips in a single semiconductor chip so that the single semiconductor chip can replace the plurality of semiconductor chips. The SIP technique enables integration of a plurality of individual semiconductor chips in a single semiconductor package so that the single semiconductor package can operate as a single system.

For example, to increase productivity of semiconductor devices, a bump may be formed on a die using a wafer bumping process so that a flip chip can be employed in place of a lead frame. Also, a wafer including a plurality of chips attached to one another may undergo a series of assembling processes, instead of being separated into individual chips, and then be sawed into individual chips, thereby manufacturing a wafer-level package (WLP). In the WLP, the chips may have the same size as the package.

However, a conventional SIP may have an increased mounting area due to horizontal arrangement of a wafer-level package.

SUMMARY

Example embodiments provide a silicon-wafer-level chip-on-chip package, a package on package, and methods of manufacturing the same in which horizontal arrangement of semiconductor chips is converted into vertical arrangement to minimize the mounting area of the semiconductor chips.

Example embodiments also provide a silicon-wafer-level chip-on-chip package, a package on package, and methods of manufacturing the same in which when semiconductor chips are stacked using a plastic substrate, a non-wet defect due to a difference in coefficients of thermal expansion (CTEs) between the plastic substrate and the semiconductor chips can be minimized.

Example embodiments also provide a silicon-wafer-level chip-on-chip package, a package on package, and methods of manufacturing the same in which packages are connected using solder balls having better attaching performance to improve solder joint reliability.

Example embodiments also provide a wafer-level chip-on-chip package including a plurality of multi-chips and a package on package including a plurality of packages having different functions, and methods of manufacturing the same, which can minimize the mounting height of stacked semiconductor packages.

Aspects of the inventive concept should not be limited by the above description, and other unmentioned aspects will be clearly understood by one of ordinary skill in the art from example embodiments described herein.

Additional aspects and utilities of the present general inventive concept will be set forth in part in the description which follows and, in part, will be obvious from the description, or may be learned by practice of the general inventive concept.

Features and/or utilities of the present general inventive concept may be realized by a method of manufacturing a package-on-package includes manufacturing a pair of packages having different functions and vertically stacking the pair of packages.

One of the pair of packages may include a memory semiconductor chip having a memory function, and the other thereof may include a logic semiconductor chip having a logic function.

The memory semiconductor chip may include a plurality of memory semiconductor chips, and the plurality of memory semiconductor chips may include a dynamic random access memory (DRAM) chip and a flash memory chip.

One of the pair of packages may be manufactured using a wafer-fabricated-package (WFP) process in which a package is fabricated at a wafer level.

The one of the pair of packages may be a wafer-level package using a silicon wafer as a substrate on which semiconductor chips are mounted, and include at least two semiconductor chips stacked on the substrate using a chip-on-chip technique.

The other of the pair of packages may include a silicon wafer as a substrate and be manufactured using a chip-embedded semiconductor package process in which semiconductor chips are inserted into the substrate.

One and the other of the pair of packages may be vertically stacked such that one surface of the one of the pair of packages faces the other surface of the other thereof.

The wafer-fabricated package process may include forming a redistribution layer and input/output (I/O) pads on one surface of a substrate. A conductive member may be formed on the one surface of the substrate having the redistribution layer and the I/O pads. The conductive member may be used to connect the one of the pair of packages with the other thereof. A semiconductor chip may be stacked on the one surface of the substrate having the conductive member. The stacked semiconductor chip may be electrically connected with the I/O pads using a connection unit. A protection member may be formed on the one surface to cover at least the semiconductor chip and the connection unit.

The method may further include thinning the substrate by lapping the other surface of the substrate, attaching a support member to the lapped surface of the substrate using a protection film, and separating the packages using a sawing process.

The I/O pads may be formed in the form of bonding fingers when the connection unit is a bonded wire, and may be formed in the form of solder lands when the connection unit is a flip chip.

The conductive member may include solder balls formed using a solder ball attaching process, and the protection member may be formed of an epoxy mold compound (EMC) to such a thickness as to bury at least half of each of the solder balls and expose at least a portion of each of the solder balls.

Features and/or utilities of the present general inventive concept may also be realized by a chip-embedded semiconductor package process that may include forming a redistribution layer and through-silicon vias by simultaneously or sequentially performing a redistribution process and a through-silicon via process on one surface of the substrate. The substrate may be thinned by back-lapping the other surface of the substrate. A cavity may be formed in the other surface of the substrate. A semiconductor chip may be mounted in the cavity. A conductive member may be formed on the one surface of the substrate. The conductive member may be connected to an external substrate module. Semiconductor packages may be separated into individual semiconductor packages using a sawing process.

The through-silicon vias may be divided into chip stack vias and package stack vias using a dry etching or laser processing process. The chip stack vias may be formed to correspond to a plurality of pins of the semiconductor chip to be mounted, and the package stack vias may be formed in a peripheral region that does not correspond to the semiconductor chip.

The cavity may be formed using a plasma etching process to such a width as to cover the chip stack vias and to such a depth as to bury the semiconductor chip to be mounted.

Features and/or utilities of the present general inventive concept may also be realized by a method of manufacturing a chip-on-chip package including forming I/O pads on one surface of a silicon wafer at a wafer level using a redistribution process, forming solder balls on one side of the silicon wafer including the I/O pads using a solder ball attaching process, stacking a semiconductor chip on the other side of the silicon wafer including the I/O pads, wholly burying the semiconductor chip and a wire using a molding process to partially expose the solder balls, and thinning the silicon wafer by lapping the other surface of the silicon wafer.

Features and/or utilities of the present general inventive concept may also be realized by a method of manufacturing a chip-on-chip package including forming a redistribution layer on one surface of a silicon wafer, forming silicon-through vias, thinning the silicon wafer by back-lapping the other surface of the silicon wafer, forming a cavity in the other surface of the silicon wafer, stacking a semiconductor chip in the cavity, sawing the silicon wafer into individual semiconductor packages, and attaching solder balls to the one surface of the silicon wafer using a solder ball attaching process.

Features and/or utilities of the present general inventive concept may also be realized by a chip-on-chip package including a silicon wafer having one surface on which a redistribution layer and input/output (I/O) pads are formed, solder balls disposed on one side of the silicon wafer having the I/O pads, a semiconductor chip stacked on the other side of the silicon wafer, a wire configured to electrically connect the semiconductor chip with the I/O pads, and a protection member configured to partially expose the solder balls and wholly bury the semiconductor chip and the wire.

Features and/or utilities of the present general inventive concept may also be realized by a package on package including a chip-on-chip package for a memory device and a chip-on-chip package for a logic circuit. The chip-on-chip package for a memory device may include a silicon wafer having one surface on which a redistribution layer and an input/output (I/O) pad are formed, solder balls disposed on one side of the silicon wafer having the I/O pads, a semiconductor chip stacked on the other side of the silicon wafer, a wire configured to electrically connect the semiconductor chip with the I/O pads, and a protection member configured to partially expose the solder balls and wholly bury the semiconductor chip and the wire. The chip-on-chip package for a logic circuit has one surface on which the redistribution layer is formed and the other surface on which the semiconductor chip is mounted, chip stack vias are formed through a region of the cavity, and package stack vias are formed through a region other than the cavity.

The solder balls of the chip-on-chip package for a memory device may be connected to the package stack vias of the chip-on-chip package for a logic circuit such that one surface of the chip-on-chip package for a memory device faces the other surface of the chip-on-chip package for a logic circuit.

Features and/or utilities of the present general inventive concept may also be realized by a method to manufacture a stacked semiconductor circuit, the method including mounting a first semiconductor chip on a first surface of a first substrate, forming first electrical connectors on the first surface of the first substrate, forming a cavity in a first surface of a second substrate, mounting a second semiconductor chip in the cavity, and connecting the first and second substrates via the first electrical connectors such that the first surface of the first substrate faces the first surface of the second substrate.

The method may further include forming first vias in the second substrate at a location corresponding to the cavity, and forming second electrical connectors on a second surface of the second substrate opposite the first surface of the second substrate to connect the second semiconductor chip to an external device.

The method may include forming second vias in the second substrate at a location outside the cavity to connect to the first electrical connectors and to connect the first semiconductor chip to the second electrical connectors.

Features and/or utilities of the present general inventive concept may also be realized by a stacked semiconductor circuit including a first substrate having a first surface, a first semiconductor chip mounted on the first surface of the first substrate, first electrical connectors located on the first surface of the first substrate, a second substrate having a first surface including a cavity, and a second semiconductor chip mounted in the cavity of the second substrate. The first substrate may be connected to the second substrate via the first electrical connectors, such that the first surface of the first substrate faces the first surface of the second substrate.

The cavity of the second substrate may have a depth greater than a height of the second semiconductor chip.

The stacked semiconductor circuit may include a protection layer covering the first surface of the first substrate and the first semiconductor chip. The protection layer may cover only a first portion of the first electrical connectors and may leave a second portion of the first electrical connectors exposed.

The second semiconductor chip may have a height greater than the depth of the cavity, but less than a distance between a bottom of the cavity and a surface of the protection layer facing the first surface of the second substrate.

The first semiconductor chip may be a memory chip and the second semiconductor chip may be a logic chip.

The stacked semiconductor circuit may include a plurality of wires to connect the first semiconductor chip to the first electrical connectors, a plurality of first vias in a portion of the second substrate corresponding to the cavity, a plurality of second vias in a portion of the second substrate outside the cavity, and second electrical connectors connected to the first and second vias to connect the first and second semiconductor chips to an external device.

Features and/or utilities of the present general inventive concept may also be realized by a computing device including a memory unit and a controller unit. The memory unit may include a first substrate having a first surface, a first semiconductor chip mounted on the first surface of the first substrate, first electrical connectors located on the first surface of the first substrate, and a controller unit to access data in the memory unit. The controller unit may include a second substrate having a first surface including a cavity and a second semiconductor chip mounted in the cavity of the second substrate. The first substrate may be connected to the second substrate via the first electrical connectors, such that the first surface of the first substrate faces the first surface of the second substrate.

Features and/or utilities of the present general inventive concept may also be realized by computing device including a memory unit, a logic unit to manipulate data stored in the memory unit, and a controller to control the memory unit and the logic unit. The memory unit may include a first substrate having a first surface, a first semiconductor chip mounted on the first surface of the first substrate, and first electrical connectors located on the first surface of the first substrate. The logic unit may include a second substrate having a first surface including a cavity and a second semiconductor chip mounted in the cavity of the second substrate. The first substrate may be connected to the second substrate via the first electrical connectors, such that the first surface of the first substrate faces the first surface of the second substrate.

BRIEF DESCRIPTION OF THE DRAWINGS

Example embodiments are described in further detail below with reference to the accompanying drawings. It should be understood that various aspects of the drawings may have been exaggerated for clarity.

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
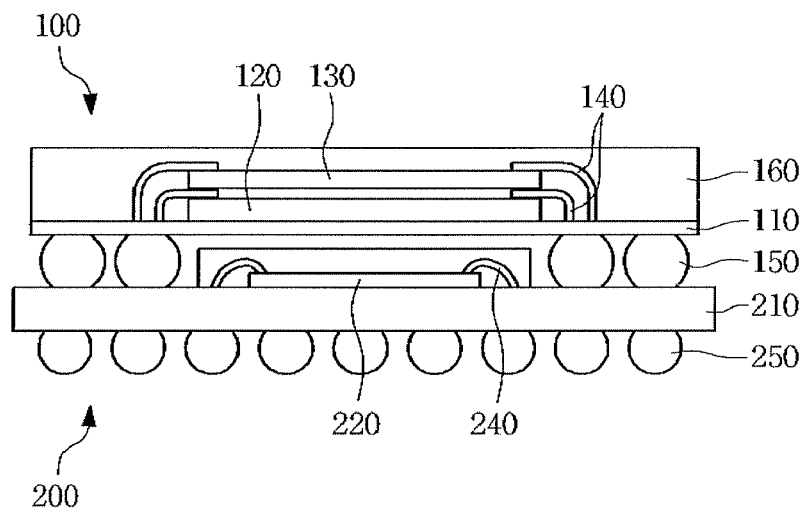
FIG. 1 is a cross-sectional view of a package on package (PoP) according to an example embodiment.

Various example embodiments will now be described more fully with reference to the accompanying drawings in which some example embodiments are shown.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

An increase in the amount of processed data has led to a need for highly integrated memory devices. Thus, various methods of applying highly integrated memory devices to systems have been proposed. For example, a package including a high-density single chip or a plurality of low-density packages may be used for systems. Hereinafter, a method of applying a plurality of low-density packages to a system will be described to increase the mounting area of the system.

To minimize the mounting area, a method of manufacturing a multi-chip package by mounting a plurality of low-density chips on a single package may be required.

Referring to FIG. 1, an upper memory package 100 may include a plurality of memory semiconductor chips 120 and 130 that are vertically stacked on an upper substrate 110, which is a printed circuit board (PCB), using a chip-on-chip technique. Although the present example embodiment describes a case in which the memory semiconductor chips 120 and 130 are of the same kind, the present inventive concept is not limited thereto and different kinds of memory semiconductor chips may be stacked in a memory package.

Each of the semiconductor chips 120 and 130 may be bonded to the upper substrate 110 using a wire 140 so that the semiconductor chips 120 and 130 may be electrically interconnected to each other. Also, upper solder balls 150 may be formed on a bottom surface of the upper substrate 110 so that the semiconductor chips 120 and 130 can be electrically connected to a upper memory package 110. The upper substrate 110 may be molded with an upper protection member 160 to protect the semiconductor chips 120 and 130 and the wire 140.

Meanwhile, referring to FIG. 1, it can be seen that the upper memory package 110 may be connected to a lower logic package 200 using a package-on-package technique. In other words, the upper solder balls 150 formed on the bottom surface of the upper substrate 110 may be adhesively mounted on a ball land region of a lower substrate 210.

The lower logic package 200 may include a logic semiconductor chip 220 stacked on the lower substrate 210, which is a PCB. Similarly, the logic semiconductor chip 220 may be bonded to the lower substrate 210 using a wire 240 and molded with a lower protection member 260. Although not shown, a plurality of vias may be formed in the lower substrate 210. The vias may be filled with a conductive member (not shown) that is connected to an external module substrate. Also, the vias may be in contact with the external module substrate through lower solder balls 250.

Accordingly, a plurality of semiconductor chips may be stacked in a package system to reduce a mounting area of the semiconductor chips.

In the above-described chip-on-chip structure, the semiconductor chips 120 and 130 may be of the same kind or different kinds. If the semiconductor chips 120, 120 have different properties from the upper substrate 110, the semiconductor chips 120 and 130 may be warped or deformed. Furthermore, when packages including the respective semiconductor chips 120 and 130 are stacked using a package-on-package technique, a non-wet defect may occur due to warping between the respective packages.

For example, when a semiconductor chip has a coefficient of thermal expansion (CTE) of about 3 to $4 \times 10^{-6}$/Co and a printed circuit board has a CTE of about 15 to $16 \times 10^{-6}$/Co, warping becomes marked due to a difference in coefficients of thermal expansion between the semiconductor chips 120 and 130 and the upper substrate 110 formed of synthetic resin.

Also, since the upper memory package 100 and the lower logic package 200 are connected by the upper solder balls 150, if the size of the upper solder balls 150 decreases, the upper and lower mounting spaces of the logic semiconductor chip 220 may be reduced. Above all, the thickness of the entire package may increase in the above-described stack structure.

Figure 2:
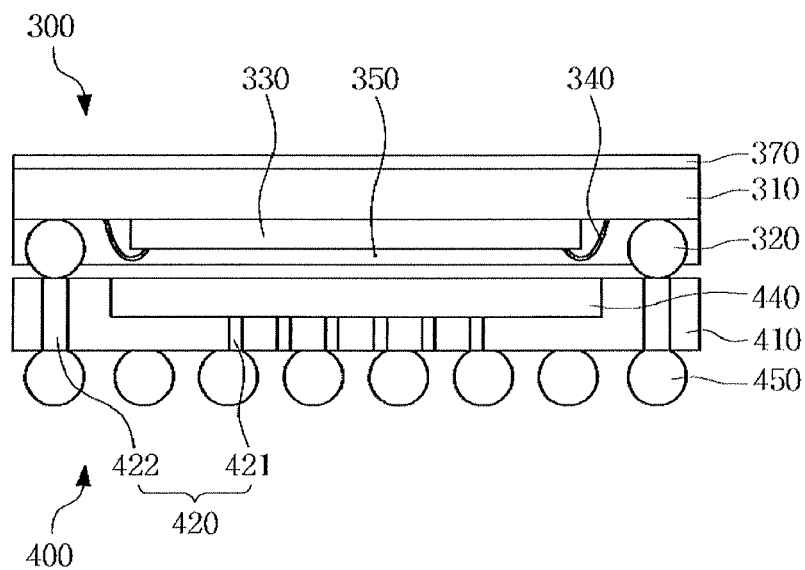
FIG. 2 is a cross-sectional view of a package on package according to another example embodiment.

According to another example embodiment, as shown in FIG. 2, an upper package 300 and a lower package 400 may be vertically stacked using a package-on-package process in order to minimize package size. In the previous example embodiment, since printed circuit boards are used as the upper and lower substrates 110 and 210, warping may occur due to a difference in coefficients of thermal expansion between the semiconductor chips 120 and 130 and the upper PCB 110, the likelihood of a solder non-wet defect may increase, and the height of the entire package may increase due to the formation of the logic semiconductor chip 220 on the lower substrate 210. In consideration of these problems, a wafer-level package in which a silicon wafer is used as a substrate on which a semiconductor chip is mounted may be applied to the present example embodiment. That is, the present example embodiment aims to minimize a difference in coefficients of thermal expansion between the upper and lower packages 300 and 400 and increase the effects of a solder ball attaching process.

To begin with, the upper package 300 may be formed using a wafer-fabricated package (WFP) process in which a package is manufactured at a wafer level.

Figure 3A:
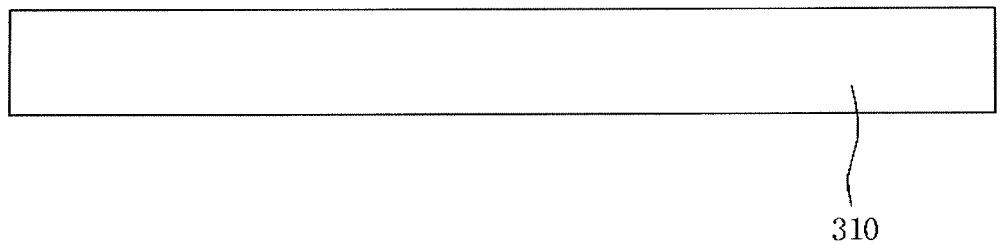
FIG. 3A is a cross-sectional view illustrating a process of redistributing an upper package according to an example embodiment.
Figure 7A:
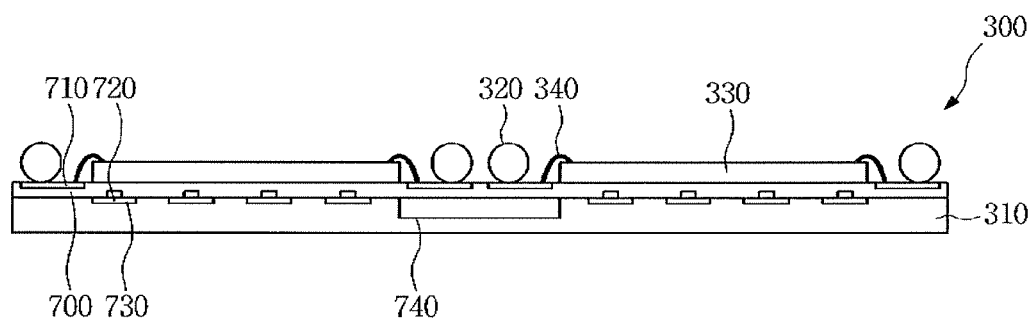
FIGS. 7A and 7B illustrate a redistribution layer of an upper semiconductor package.
Figure 7B:
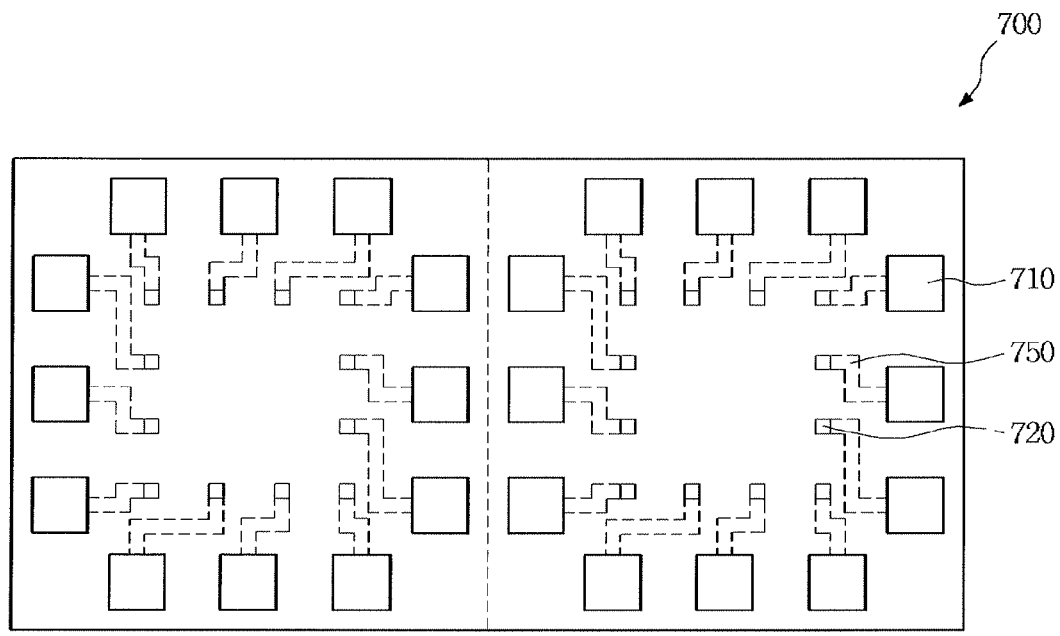

Referring to FIGS. 3A, 7A, and 7B, a redistribution process may be performed on an upper substrate 310. The upper substrate 310 may be a wafer formed of at least silicon. Thus, an integrated circuit (IC) 740 and a plurality of input/output (I/O) pads 730 may be formed on the upper substrate 310, and a redistribution layer 700 may be deposited. The I/O pads 730 may function as internal connection terminals that may be electrically connected by wire-bonding to a semiconductor chip 330 to be stacked.

As shown in FIGS. 7A and 7B, the redistribution layer 700 may be located between the upper substrate 300 and a mounted semiconductor chip 330 and upper conductive members 320. The redistributive layer 700 may include connection pads 720 on a first side to connect to the I/O pads 730 of the first substrate 310 and connection pads 710 on a second side opposite the first side to connect to wires 340 and/or upper conductive members 320. The redistribution layer 700 may also include wiring 750 to connect the connection pads 720 on the first side to the connection pads 710 on the second side.

Figure 3B:
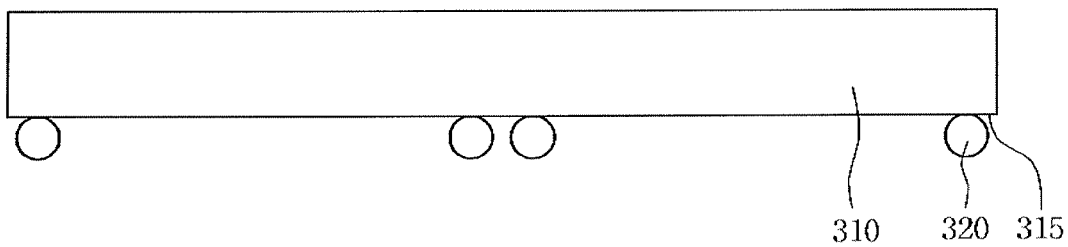
FIG. 3B is a cross-sectional view illustrating a solder ball attaching process performed on an upper package according to an example embodiment.

Referring to FIG. 3B, an upper conductive member 320 may be formed on a front surface 315 of the upper substrate 310 on which the redistribution process is performed. The upper conductive member 320 may be formed on the front surface 315 of the upper substrate 310 using a solder ball attaching process. Solder balls may be connected to the I/O pads 730 via the redistribution layer 700 and function as external connection terminals.

The solder ball attaching process may involve a reflow process. Thus, a thermal process required for the reflow process inevitably results in wafer warping. However, according to the present example embodiment, since the solder ball attaching process is followed by a process of thinning the upper substrate 310, wafer warping may decrease.

Figure 3C:
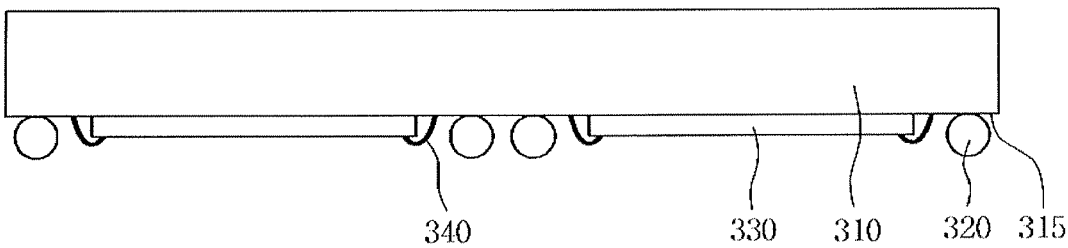
FIG. 3C is a cross-sectional view illustrating a chip stacking process performed on an upper package according to an example embodiment.

Referring to FIG. 3C, a semiconductor chip 330 may be stacked on the front surface of the upper substrate 310. The semiconductor chip 330 may include a single memory semiconductor chip or a plurality of memory semiconductor chips. When the semiconductor chip 330 includes the plurality of memory semiconductor chips, the semiconductor chip 330 may include memory semiconductor chips of the same kind or different kinds of memory semiconductor chips, such as a dynamic random access memory (DRAM) chip and a flash memory chip.

The stacked semiconductor chip 330 may be electrically connected to the I/O pads 730 using a wire bonding process to connect the wire 340 to the redistribution layer 700. The I/O pads 730 may further be connected to the lower package 400 by connecting the upper conductive members 320 to the lower package 400.

However, the I/O pads that receive an external signal or output a processed signal may be freely changed according to desired operations. The I/O pads 730 may be bonding fingers or solder lands depending on whether a wire bonding process or a solder ball attaching process is performed and is not necessarily limited to specific shapes.

Figure 3D:
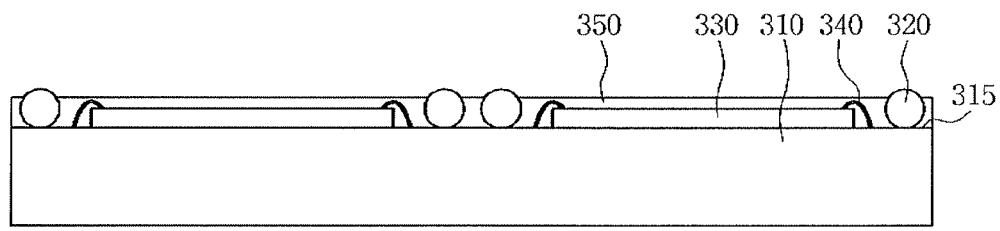
FIG. 3D is a cross-sectional view illustrating a molding process performed on an upper package according to an example embodiment.

Referring to FIG. 3D, a molding process may be performed on the front surface 315 of the upper substrate 310. Thus, an upper protection member 350 made of an epoxy mold compound (EMC) may be formed. The upper protection member 350 may be formed to such a thickness as to protect the front surface 315 of the upper substrate 310 including the semiconductor chip 330 or the bonded wire 340 and not to entirely bury the upper conductive members 320, or solder balls. For example, the upper protection member 350 may be formed to bury at least half the upper conductive member 320, or solder ball, and expose at least a portion of the solder ball. In the present example embodiment, the upper protection member 350 may strongly fix the conductive member 320 onto the upper substrate 310.

Figure 5:
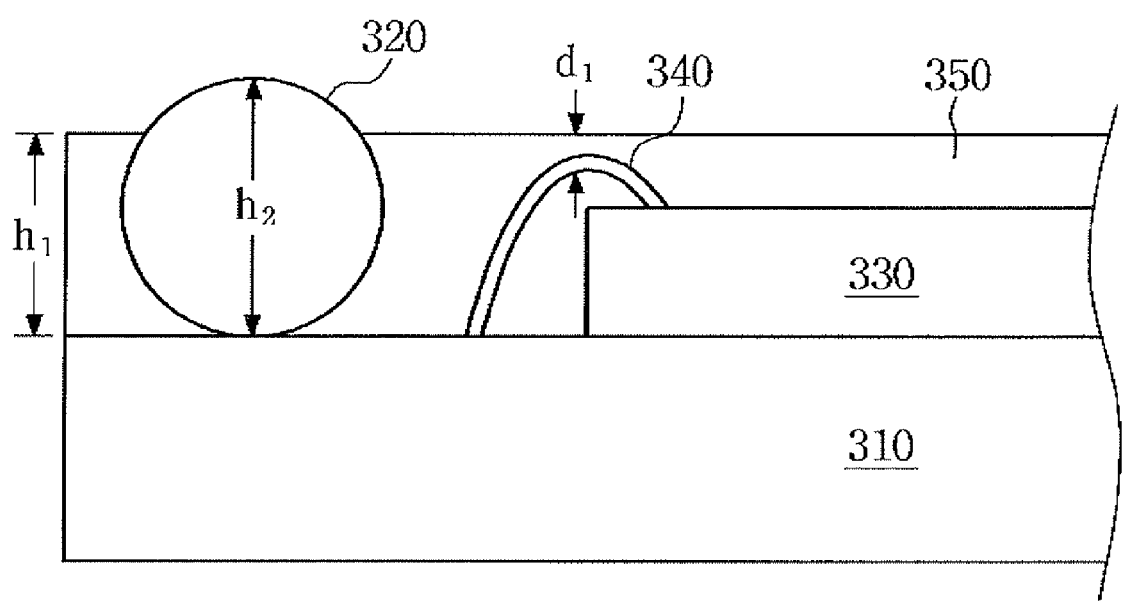
FIG. 5 illustrates an upper conductive member and an upper protection member.

As illustrated in FIG. 5, the upper protection member 350 has a height $h_1$ that is less than a height $h_2$ of the upper conductive member 320, such as a solder ball. The upper protection member 350 may cover the wire 340, the semiconductor chip 330, and a portion of the upper conductive member 320. The upper protection member may have a thickness $d_1$ between the wire 340 and an outer surface. A portion of the upper conductive member 320 may be exposed to connect to an external device (not shown).

Although the upper conductive members 320, or the solder balls, may be fixed onto the upper substrate 310 using a reflow process, the problem of a non-wet defect may arise due to the degradation of solder joint reliability. Accordingly, to markedly improve the fastness of the upper conductive members 320, or solder balls, the upper substrate 310 may be molded to partially expose the solder balls 320 and partially bury the solder balls 320. As a result, solder joint reliability may be enhanced.

However, considering that a melting point of a solder ball is about 250° C., the molding process may be performed at an appropriate temperature of about 170° C. to 180° C.

Figure 3E:
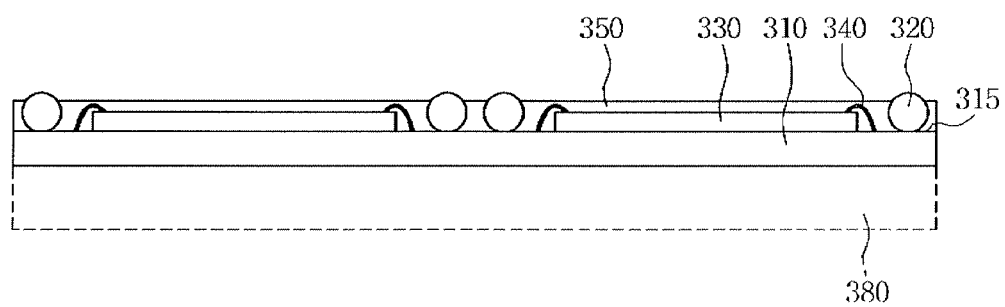
FIG. 3E is a cross-sectional view illustrating a thinning process performed on an upper package according to an example embodiment.

Referring to FIG. 3E, a rear portion 380 of the upper substrate 310 may be back-lapped to thin the upper substrate 310. To minimize the height of the stacked semiconductor package, the rear portion 380 of the upper substrate 310 may be polished to a predetermined thickness during the thinning process. In the present example embodiment, since the front surface 315 of the upper substrate 310 is supported by the protection member 350 formed of the EMC, even if the rear surface of the upper substrate 310 is thinned, the upper substrate 310 is not bent.

Figure 3F:
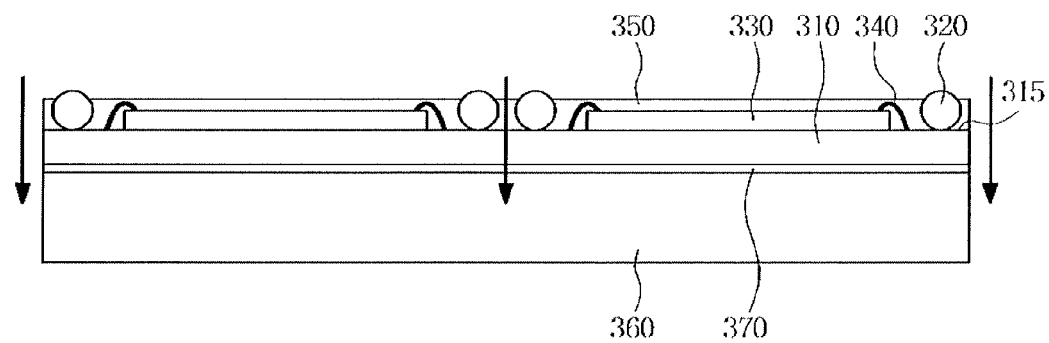
FIG. 3F is a cross-sectional view illustrating a separation process performed on an upper package according to an example embodiment.

Referring to FIG. 3F, to protect a bare silicon surface, a support member 360 may be attached to the rear surface of the back-lapped upper substrate 310 using a protection film 370. Finally, packages may be separated into individual packages, and the individual packages may be easily separated from the support member and employed in a subsequent package-on-package process. The separation process may be a cutting process, for example, as indicated by the arrows illustrated in FIG. 3F.

Here, spatially relative terms, such as "upper," "lower," "front surface," "rear surface" and the like, may be used herein for ease of description to describe one element or feature's relationship to another element(s) or feature(s) as illustrated in the figures and are not intended to be limiting of positions and directions.

Next, the lower package 400 may be formed using a method of manufacturing a chip-embedded semiconductor package in which a semiconductor chip is inserted into a substrate.

Figure 4A:
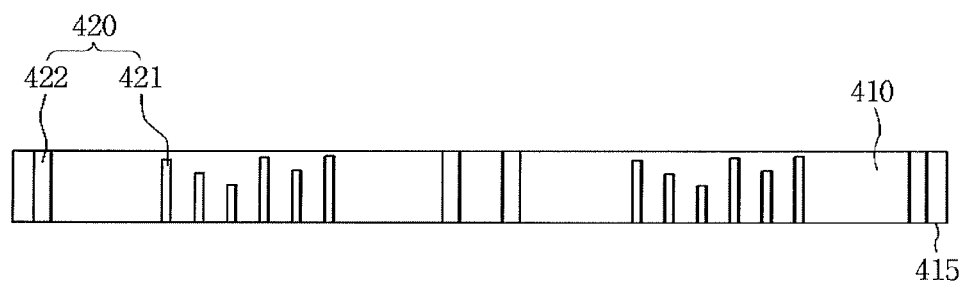
FIG. 4A is a cross-sectional view illustrating a redistribution process and a through via process performed on a lower package according to an example embodiment.
Figure 8A:
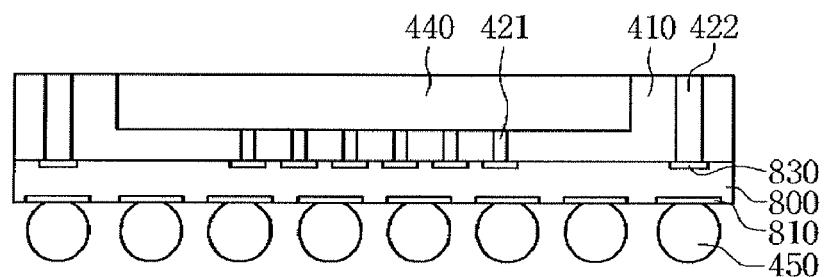
FIGS. 8A and 8B illustrate a redistribution layer of a lower semiconductor package.
Figure 8B:
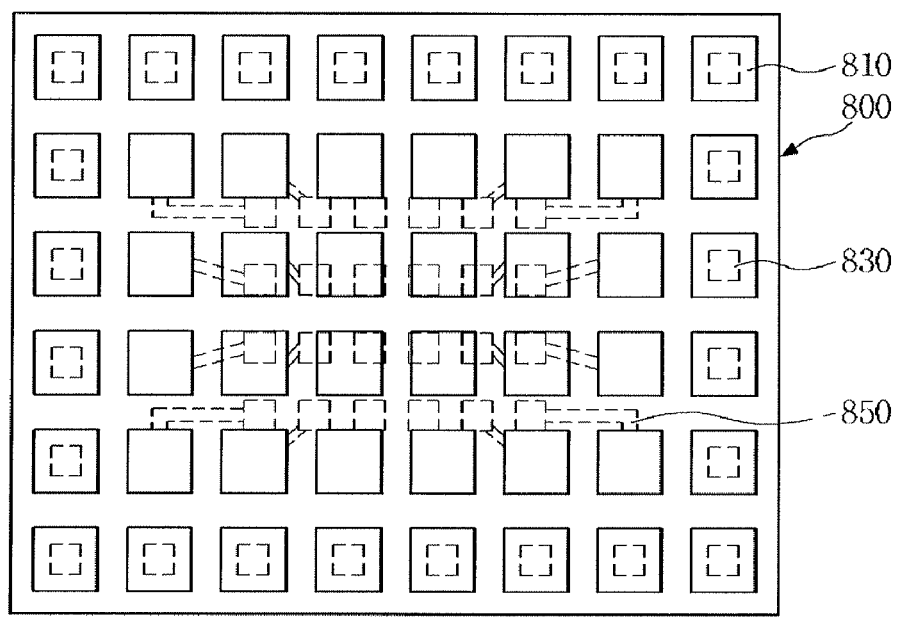

Referring to FIGS. 4A, 8A, and 8B, a redistribution process and a through-silicon via process may be simultaneously or sequentially performed on the lower substrate 410. Like the upper substrate 310, the lower substrate 410 may be a wafer formed of at least silicon. An additional pattern, such as the IC 740 of the upper substrate 310, may not be formed on the lower substrate 410.

The redistribution layer 800 illustrated in FIGS. 8A and 8B is similar to the redistribution layer 700 illustrated in FIGS. 7A and 7B. I/O pads 830 may be formed on or in the lower substrate 410. Connection pads 810 may be located on a side opposite the I/O pads 830 to connect to lower conductive members 450. The I/O pads 830 may be connected to the package stack vias 422 to connect to the first semiconductor chip 330 and to the chip stack vias 421 to connect to the second semiconductor chip 440. Wiring 850 may connect the I/O pads 830 to the connection pads 810.

A plurality of I/O pads 830 may be formed on a front surface 415 of the lower substrate 410 to electrically connect an embedded semiconductor chip, which will be described later, with an external substrate module using through-silicon vias 420, and a redistribution layer 800 may be deposited using the redistribution process. The I/O pads 830 may serve as internal connection terminals electrically connected to an external substrate.

Figure 4B:
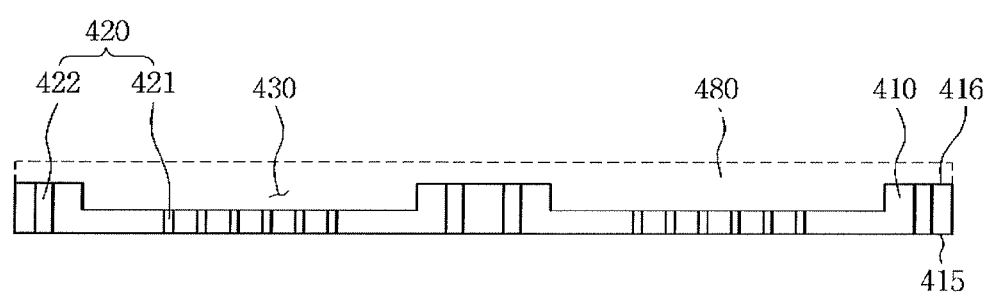
FIG. 4B is a cross-sectional view illustrating a thinning process and a cavity process performed on a lower package according to an example embodiment.
Figure 4C:
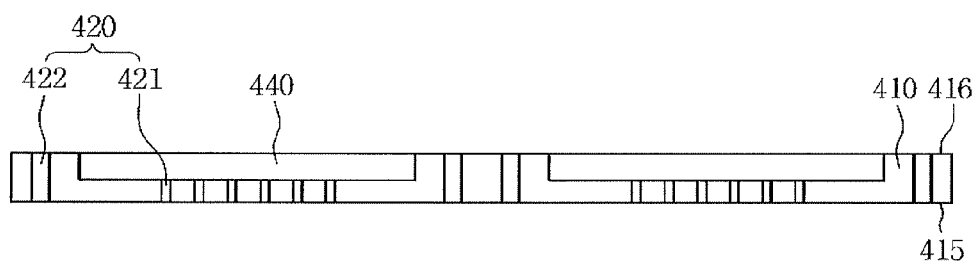
FIG. 4C is a cross-sectional view illustrating a chip stack process performed on a lower package according to an example embodiment.

Referring to FIGS. 4B and 4C, a rear portion 480 of the lower substrate 410 may be back-lapped to thin the lower substrate 410. Also, a cavity 430 may be formed in the rear surface 416 of the lower substrate 410 to correspond to the location of the through-silicon vias 420. The cavity 430 may be formed to a minimum depth such that a semiconductor chip 440 to be mounted does not protrude past the rear surface 416. The cavity 430 may be formed using a plasma etching process, for example.

Figure 6A:
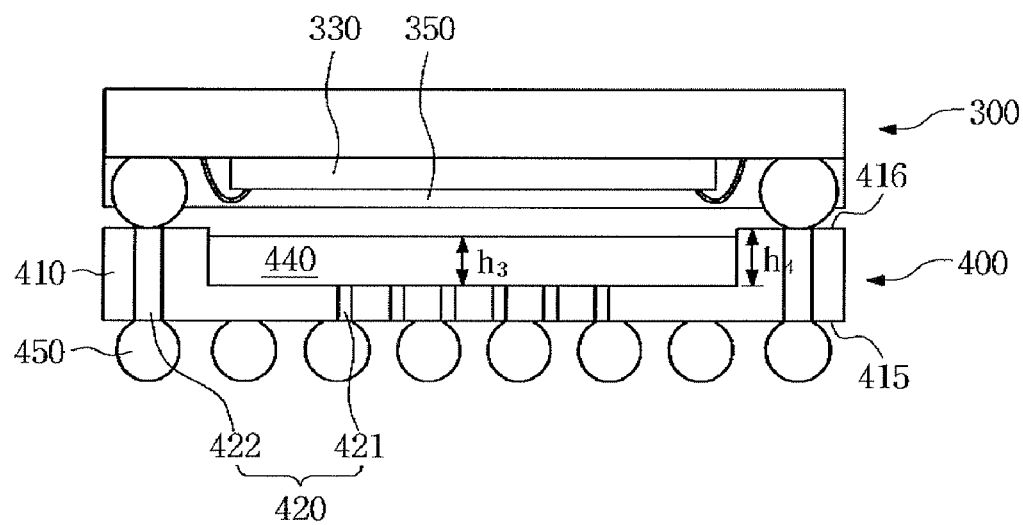
FIGS. 6A and 6B illustrate a semiconductor chip mounted in a cavity of a substrate
Figure 6B:
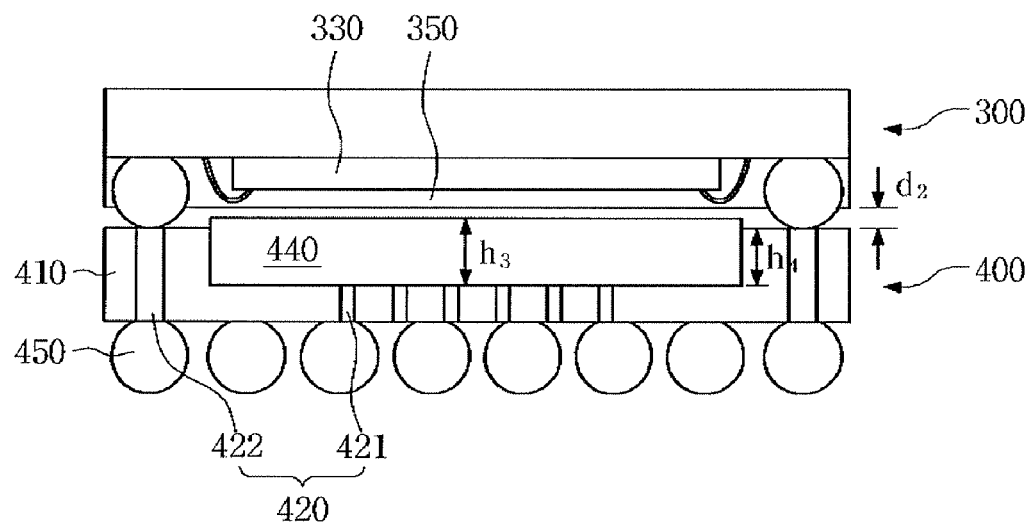

FIGS. 6A and 6B illustrate semiconductor chips 440 in the cavity 430 of the lower substrate 410. As shown in FIG. 6A, the semiconductor chip 440 has a height $h_3$ that is smaller than a dept $h_4$ of the cavity 430 of the lower substrate 410. FIG. 6B illustrates a semiconductor chip 440 having a height $h_3$ greater than the depth $h_4$ the cavity 430 of the lower substrate 410. The cavity 430 of the lower substrate 410 is of such a depth $h_4$ that when the upper package 300 is connected to the lower package 400, the semiconductor chip 440 does not contact the upper protection layer 350 of the upper package 300. In other words, the rear surface 416 of the lower substrate 410 is separated from a surface of the protection layer 350 by a distance $d_2$ which is greater than zero, and the semiconductor chip 440 may protrude from the cavity 430 by a distance less than $d_2$.

The lower substrate 410 differs from the upper substrate 310 in that a plurality of through-silicon vias 420 may be formed in the lower substrate 410 to embed a semiconductor chip 440 for a logic circuit in the lower substrate 410. That is, the cavity 430 in which the semiconductor chip 440 is embedded may be formed in the rear surface 416 of the lower substrate 410, and the plurality of through-silicon vias 420 may be formed in a portion of the cavity 430 where the semiconductor chip is mounted.

The through-silicon vias 420 may be chip stack vias 421 configured to internally connect the lower substrate 410 and the semiconductor chip 440 and package stack vias 422 configured to externally connect the upper and lower substrates 310 and 410. Thus, the chip stack vias 421 may be formed to correspond to a plurality of pins of the semiconductor chip to be mounted, and the package stack vias 422 may be formed in a peripheral region that does not correspond to the semiconductor chip 440.

In particular, in the present example embodiment, the cavity 430 is formed in the rear surface 416 of the lower substrate 410 and the through-silicon vias 420 are formed in the lower substrate 410 corresponding to the cavity 430 because a logic semiconductor chip 440 includes a plurality of pins unlike a memory semiconductor chip. Since the plurality of pins are not suited to be connected to one another by a wire-bonding technique, the through-silicon vias 420 may be used to electrically connect the plurality of pins, and thus the cavity 430 in which the semiconductor chip will be mounted may be required. Also, when the plurality of pins are connected to one another using the through-silicon vias 420, a mounting area may be reduced more than when a wire bonding technique is applied.

The through-silicon vias 420 may be formed using a dry etching process, but the present inventive concept is not limited thereto. For example, the through-silicon vias 420 may be formed using a laser processing technique. A PCB precludes formation of the through-silicon vias 420 using an etching process, while a silicon wafer facilitates formation of the through-silicon vias 420 using not only a laser processing technique but also an etching process. A conductive metal, such as gold (Au) or copper (Cu), may be plated or deposited in the through-silicon vias 420.

Referring to FIG. 4C, after the cavity 430 is formed, a logic semiconductor chip 440 may be stacked on the lower substrate 410. That is, the logic semiconductor chip 440 may be mounted in the lower substrate 410. As described above, the logic semiconductor chip 440 may be installed to allow a plurality of pins of the semiconductor chip 440 to appropriately correspond to the through-silicon vias 420.

Figure 4D:
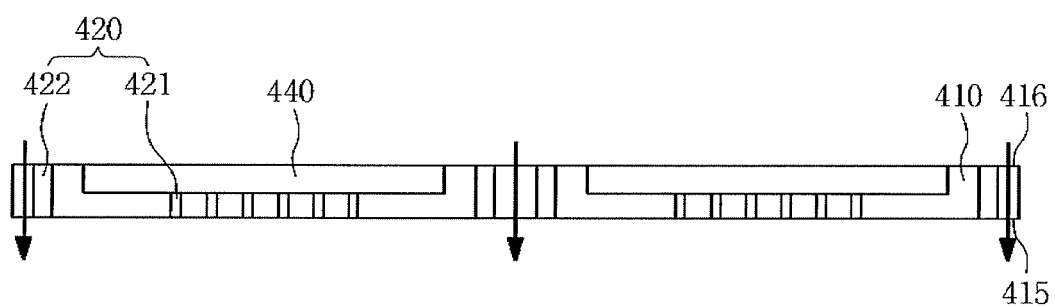
FIG. 4D is a cross-sectional view illustrating a separation process performed on a lower package according to an example embodiment.

Referring to FIG. 4D, the lower substrate 410 may be separated into individual semiconductor packages 400 using a sawing process. In another example embodiment, the sawing process may be performed after a solder ball attaching process that will be described later.

Figure 4E:
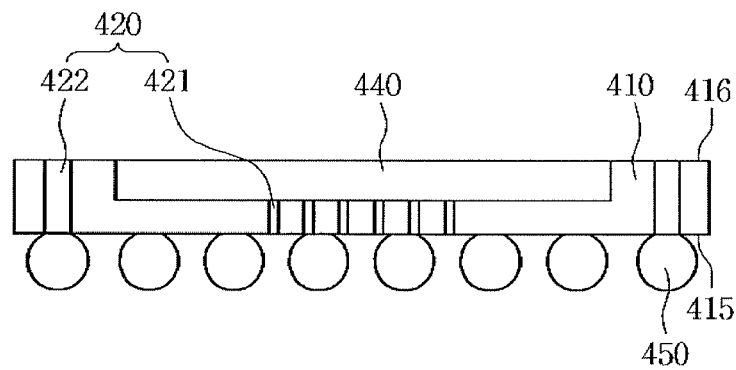
FIG. 4E is a cross-sectional view illustrating a solder ball attaching process performed on a lower package according to an example embodiment.

Referring to FIG. 4E, a lower conductive member 450 configured to connect the lower package 400 with an external substrate module may be formed on the front surface 415 of the lower substrate 410 on which the redistribution process is performed. The lower conductive member 450 may include solder balls formed using a solder ball attaching process. The solder balls may be connected to the I/O pads 830 by the redistribution layer 800 and function as external connection terminals.

After the lower package 400 is completed in the above-described manner, a package-on-package process may be finally performed to vertically stack the prepared upper and lower packages 300 and 400. In this case, the semiconductor chips 330 and 440 may be stacked under the upper substrate 310 such that the front surface 315 of the upper package 300 is disposed opposite the rear surface 416 of the lower package 400.

The upper conductive member 320 of the upper package 300 may be electrically connected to the lower conductive member 450 of the lower package 400 by the package stack vias 422.

When the upper and lower packages 300 and 400 are bonded to each other using the upper conductive members 320, the upper substrate 310 has the same coefficient of thermal expansion (CTE) as the lower substrate 410. In other words, the upper and lower substrates 310 and 410 have the same CTE as the semiconductor chips 330 and 440, and thus the occurrence of warping and damage to the upper and lower packages 300 and 400 due to external shock may be minimized.

As described above, an upper package including a memory semiconductor chip may include a silicon wafer as an upper substrate on which the memory semiconductor chip will be mounted, so as to minimize warping due to a difference in coefficients of thermal expansion. Simultaneously, to enhance the attaching performance of solder balls, the upper substrate having the memory semiconductor chip may be molded with an epoxy mold compound while partially exposing the solder balls. Furthermore, to minimize a mounting area and reduce a stacked thickness, a logic semiconductor chip may be mounted on a lower package at a wafer level and inserted into a cavity having a plurality of vias so that a plurality of pins are connected to the vias of a lower substrate. As a result, a front surface of the upper substrate including the memory semiconductor chip and the solder balls faces downward, while a rear surface of the lower substrate in which the logic semiconductor chip is inserted faces upward.

According to the construction of the inventive concept as explained thus far, the following effects can be expected:

First, a plurality of low-density semiconductor chips may be stacked using a chip-on-chip technique, and a plurality of packages having different functions may be stacked using a package-on-package technique so that mounting areas of the semiconductor chips and packages may be minimized.

Second, since a silicon wafer may be used as a substrate and a semiconductor chip may be stacked on and connected to the silicon wafer, the occurrence of warping due to a difference in coefficients of thermal expansion may be prevented.

Third, solder balls may be disposed on a front surface of the silicon wafer on which the semiconductor chip is stacked, and the silicon wafer may be molded with an epoxy mold compound (EMC) to partially expose the solder balls. As a result, the entire thickness of packages may be reduced, and the solder balls may be strongly fixed to the silicon wafer, thus improving solder joint reliability.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A chip-on-chip package, comprising:
    a silicon wafer having a redistribution layer and input/output (I/O) pads formed thereon;
    solder balls located on the redistribution layer of the silicon wafer and electrically connected to the I/O pads;
    a semiconductor chip stacked on the redistribution layer of the silicon wafer;
    a wire to electrically connect the semiconductor chip with the I/O pads; and
    a protection member configured to partially expose the solder balls and to entirely bury the semiconductor chip and the wire.

2. A package on package comprising:
    a first semiconductor package using a wafer-fabricated package (WFP) in which a package is fabricated at a wafer level; and
    a second semiconductor package having different functions from the first semiconductor package, wherein the second semiconductor package includes:
    a first substrate formed of silicon wafer and having a cavity;
    a first semiconductor chip mounted in the cavity;
    chip stack vias penetrating through the first substrate corresponding to the cavity; and
    package stack vias penetrating through a region other than the cavity.

3. The package on package according to claim 2, wherein the first semiconductor package includes a memory semiconductor chip having a memory function, and the second semiconductor package includes a logic semiconductor chip having a logic function.

4. The package on package according to claim 3, wherein the first semiconductor package includes a plurality of memory semiconductor chips, and the plurality of memory semiconductor chips include a dynamic random access memory (DRAM) chip and a flash memory chip.

5. The package on package according to claim 2, wherein the first semiconductor package comprises:

a second substrate formed of silicon wafer and having a redistribution layer and an input/output (I/O) pad formed thereon;

solder balls disposed on the redistribution layer corresponding to the I/O pad;

a second semiconductor chip stacked on the redistribution layer;

a wire to electrically connect the second semiconductor chip to the I/O pads; and a protection member configured to partially expose the solder balls and to entirely bury the second semiconductor chip and the wire.

6. The package on package according to claim 5, wherein the solder balls of the first semiconductor package are connected to the package stack vias of the second semiconductor package such that a first surface of a second substrate of the first semiconductor package faces a second surface of the first substrate of the second semiconductor package.

7. A stacked semiconductor circuit, comprising:

a first substrate having a first surface;

a first semiconductor chip mounted on the first surface of the first substrate; first electrical connectors located on the first surface of the first substrate;

a second substrate having a first surface including a cavity;

a second semiconductor chip mounted in the cavity of the second substrate;

a plurality of wires to connect the first semiconductor chip to the first electrical connectors;

a plurality of first vias in a portion of the second substrate corresponding to the cavity;

a plurality of second vias in a portion of the second substrate outside the cavity; and second electrical connectors connected to the first and second vias to connect the first and second semiconductor chips to an external device, wherein the first substrate is connected to the second substrate via the first electrical connectors, such that the first surface of the first substrate faces the first surface of the second substrate.

8. The stacked semiconductor circuit according to claim 7, wherein the cavity of the second substrate has a depth greater than a height of the second semiconductor chip.

9. The stacked semiconductor circuit according to claim 7, further comprising a protection layer covering the first surface of the first substrate and the first semiconductor chip.

10. The stacked semiconductor circuit according to claim 9, wherein the protection layer covers only a first portion of the first electrical connectors and leaves a second portion of the first electrical connectors exposed.

11. The stacked semiconductor circuit according to claim 9, wherein the second semiconductor chip has a height greater than the depth of the cavity, but less than a distance between a bottom of the cavity and a surface of the protection layer facing the first surface of the second substrate.

12. The stacked semiconductor circuit according to claim 7, wherein the first semiconductor chip is a memory chip and the second semiconductor chip is a logic chip.

13. The stacked semiconductor circuit according to claim 7, wherein the first semiconductor chip is connected to first connection pads of the first substrate via external wires, and the second semiconductor chip is a flip-chip mounted chip connected to second connection pads of the second substrate without external wires.

* * * * *